(12) United States Patent
Morita et al.

(10) Patent No.: US 10,388,618 B2
(45) Date of Patent: Aug. 20, 2019

(54) SEMICONDUCTOR DEVICE AND METHOD OF MANUFACTURING A SEMICONDUCTOR DEVICE

(71) Applicant: ABLIC Inc., Chiba-shi, Chiba (JP)

(72) Inventors: Takeshi Morita, Chiba (JP); Shinjiro Kato, Chiba (JP); Masaru Akino, Chiba (JP); Yukihiro Imura, Chiba (JP)

(73) Assignee: ABLIC Inc., Chiba (JP)

( * ) Notice: Subject to any disclaimer, the term of this patent is extended or adjusted under 35 U.S.C. 154(b) by 0 days.

(21) Appl. No.: 16/272,678

(22) Filed: Feb. 11, 2019

(65) Prior Publication Data

US 2019/0189575 A1 Jun. 20, 2019

Related U.S. Application Data

(62) Division of application No. 15/915,970, filed on Mar. 8, 2018, now Pat. No. 10,249,584.

(30) Foreign Application Priority Data

Mar. 14, 2017 (JP) .................................. 2017-048799

(51) Int. Cl.
*H01L 23/48* (2006.01)
*H01L 23/00* (2006.01)

(52) U.S. Cl.
CPC ............ *H01L 24/05* (2013.01); *H01L 23/562* (2013.01); *H01L 23/564* (2013.01); *H01L 24/03* (2013.01); *H01L 2224/0226* (2013.01); *H01L 2224/02251* (2013.01); *H01L 2224/02255* (2013.01); *H01L 2224/03011* (2013.01); *H01L 2224/0362* (2013.01); *H01L 2224/03614* (2013.01); *H01L 2224/05008* (2013.01); *H01L 2224/05124* (2013.01); *H01L 2924/04941* (2013.01);
(Continued)

(58) Field of Classification Search
CPC ............... H01L 24/05; H01L 2224/022; H01L 2224/02215; H01L 2924/04941; H01L 2924/05052; H01L 2924/05442; H01L 23/562
USPC ......................................................... 438/652
See application file for complete search history.

(56) References Cited

U.S. PATENT DOCUMENTS 7,122,902 B2 * 10/2006 Hatano ............. H01L 23/53223
257/762
7,250,681 B2 7/2007 Matsunaga
(Continued)

FOREIGN PATENT DOCUMENTS

JP 5443827 B2 3/2014

*Primary Examiner* — Nitin Parekh
(74) *Attorney, Agent, or Firm* — Brinks Gilson & Lione (57) ABSTRACT

A semiconductor device (10) includes: a substrate (1); a wiring (6) formed above the substrate (1); a titanium nitride film (7) formed on the wiring (6); an oxide film (3) formed on the titanium nitride film (7); a silicon nitride film (4) formed on the oxide film (3); and a pad portion (8) exposing the wiring (6), and formed at a place where a first opening portion (91) formed in the silicon nitride film (4) and a second opening portion (92) formed in the titanium nitride film (7) overlap with each other in plan view, and being inside a third opening portion (93) formed in the oxide film (3) in plan view, wherein the silicon nitride film (4) is formed on top of and in contact with the titanium nitride film (7) inside the third opening portion (93) in plan view.

2 Claims, 5 Drawing Sheets (52) U.S. Cl.
CPC .............. *H01L 2924/05042* (2013.01); *H01L 2924/05442* (2013.01); *H01L 2924/3512* (2013.01)

(56) References Cited

U.S. PATENT DOCUMENTS

| | | | |
|---|---|---|---|
| 7,473,999 B2 | 1/2009 | Lin et al. | |
| 8,022,552 B2 | 9/2011 | Lin et al. | |
| 8,373,270 B2 | 2/2013 | Homma et al. | |
| 2002/0011669 A1* | 1/2002 | Fujiki | H01L 24/05 257/751 |
| 2006/0249845 A1* | 11/2006 | Takai | H01L 23/3192 257/750 |
| 2008/0088023 A1 | 4/2008 | Oda | |
| 2008/0290516 A1* | 11/2008 | Oda | H01L 23/53238 257/751 |
| 2009/0121337 A1* | 5/2009 | Abe | H01L 21/67092 257/686 |
| 2010/0184285 A1* | 7/2010 | Hua | H01L 24/03 438/612 |
| 2010/0295044 A1* | 11/2010 | Homma | H01L 22/32 257/48 |
| 2011/0209899 A1 | 9/2011 | Hill | |
| 2014/0027928 A1* | 1/2014 | Watanabe | H01L 23/562 257/774 |
| 2018/0374795 A1* | 12/2018 | Deguchi | H01L 24/03 |

\* cited by examiner

SEMICONDUCTOR DEVICE AND METHOD OF MANUFACTURING A SEMICONDUCTOR DEVICE

RELATED APPLICATIONS

This application is a divisional patent application of U.S. application Ser. No. 15/915,970, filed Mar. 8, 2018, which claims priority under 35 U.S.C. § 119 to Japanese Patent Application No. 2017-048799 filed on Mar. 14, 2017, the entire content of which is hereby incorporated by reference.

BACKGROUND OF THE INVENTION

1. Field of the Invention

The present invention relates to a semiconductor device and a method of manufacturing a semiconductor device.

2. Description of the Related Art

An existing semiconductor device includes a wiring made of aluminum or an aluminum alloy and formed on a substrate, an anti-reflection film made of titanium nitride and formed on the wiring, and an oxide film formed on the anti-reflection film, and a pad portion which exposes the wiring is formed at a place where an opening portion formed in the oxide film and an opening portion formed in the anti-reflection film overlap with each other in plan view.

In a semiconductor device having such a structure, titanium nitride forming the anti-reflection film is sometimes corroded in a portion surrounding the opening portion by a long-term reliability test that involves bias application under a high-temperature and high-humidity environment, abbreviated as THB (Temperature Humidity Bias).

To solve this problem, a semiconductor device has been proposed in which titanium nitride forming the anti-reflection film is not exposed in the opening portion.

For example, in Japanese Patent No. 5443827, there is proposed a semiconductor device including: a first surface protection film with a first opening portion formed above a pad; and a second surface protection film formed on the pad and the first surface protection film to have a second opening portion above the pad, in which the pad includes a first conductor film and an anti-reflection film formed on the first conductor film, the second opening portion is contained in an inner region of the first opening portion, and the anti-reflection film is removed from the inner region of the first opening portion.

However, the technology described in Japanese Patent No. 5443827 which involves removing the anti-reflection film from the inner region of the first opening portion formed in the first surface protection film has a problem in that, after the first surface protection film formed from a silicon oxide film is patterned and etched in order to form the first opening portion, etching gas needs to be switched to etch and remove the anti-reflection film made of titanium nitride, thereby increasing the number of steps.

In addition, in a semiconductor device of the related art, particularly one in which a silicon oxide film is formed on an anti-reflection film made of titanium nitride, the anti-reflection film may change into titanium oxide due to the long-term reliability test (THB) that involves bias application under a high-temperature and high-humidity environment, resulting in a possible impairment of the external appearance.

SUMMARY OF THE INVENTION

The present invention provides a semiconductor device that is resistant to the corrosion of titanium nitride forming an anti-reflection film, despite the placement of a silicon oxide film on the anti-reflection film made of titanium nitride, and is reduced in the number of manufacturing steps, and a method of manufacturing the semiconductor device.

Through extensive research, the inventors of the present invention have thought of a semiconductor device in which a pad portion exposing a wiring is formed at a place where a first opening portion formed in a silicon nitride film, which serves as a protection film, and a second opening portion formed in a titanium nitride film, which serves as an anti-reflection film, overlap with each other in plan view, and is inside a third opening portion formed in an oxide film in plan view, and the silicon nitride film is formed on top of and in contact with the titanium nitride film inside the third opening portion in plan view, which leads to the present invention.

Specifically, the present invention relates to the following items.

According to one embodiment of the present invention there is provided a semiconductor device including:
 a substrate;
 a wiring formed above the substrate;
 a titanium nitride film formed on the wiring;
 an oxide film formed on the titanium nitride film;
 a silicon nitride film formed on the oxide film; and
 a pad portion exposing the wiring, and formed at a place where a first opening portion formed in the silicon nitride film and a second opening portion formed in the titanium nitride film overlap with each other in plan view, and being inside a third opening portion formed in the oxide film in plan view, and
 the silicon nitride film being formed on top of and in contact with the titanium nitride film inside the third opening portion in plan view.

According to one embodiment of the present invention there is provided a method of manufacturing a semiconductor device including:
 forming a wiring above a substrate;
 forming a titanium nitride film on the wiring;
 forming an oxide film on the titanium nitride film, and patterning the oxide film to form a third opening portion which exposes the titanium nitride film at a bottom of the third opening portion through the oxide film;
 forming a silicon nitride film on the oxide film and on the third opening portion; and
 etching the silicon nitride film and the titanium nitride film successively with the same etching gas to form a pad portion which penetrates the silicon nitride film and the titanium nitride film, and which exposes the wiring at the bottom inside the third opening portion in plan view.

In the semiconductor device of the present invention, the pad portion exposing the wiring is formed at a place where the first opening portion formed in the silicon nitride film and the second opening portion formed in the titanium nitride film overlap with each other in plan view, and is inside the third opening portion formed in the oxide film in plan view, and the silicon nitride film is formed on top of and in contact with the titanium nitride film inside the third opening portion in plan view. This makes the titanium nitride film serving as the anti-reflection film resistant to corrosion, thereby giving the semiconductor device high reliability.

Further, in the semiconductor device of the present invention, the pad portion exposing the wiring is formed at a place where the first opening portion formed in the silicon nitride film and the second opening portion formed in the titanium nitride film overlap with each other in plan view, and is inside the third opening portion formed in the oxide film in plan view, and the silicon nitride film is formed on top of and in contact with the titanium nitride film inside the third opening portion in plan view. The first opening portion and the second opening portion can thus be formed by etching the silicon nitride film and the titanium nitride film successively with the use of the same mask and the same etching gas, contributing efficient production of the semiconductor device.

DESCRIPTION OF THE EMBODIMENTS

The inventors of the present invention have acquired the following findings as a result of extensive research.

The inventors of the present invention have examined the corrosion of the titanium nitride film caused by a long-term reliability test (THB) that involves bias application under a high-temperature and high-humidity environment in a semiconductor device of the related art which includes an anti-reflection film made of titanium nitride.

The examination has revealed that a surface of the titanium nitride film which opposes the oxide film in the vicinity of the opening portion for exposing the pad portion is particularly liable to corrode when the titanium nitride film and an oxide film are formed on a wiring in the stated order, and a pad portion which exposes the wiring is formed at a place where a third opening portion formed in the oxide film and a second opening portion formed in the titanium nitride film overlap with each other in plan view.

It is presumed that the corrosion in the surface of the titanium nitride film which opposes the oxide film is accelerated by the generation of titanium oxide as a result of reaction between titanium atoms in the titanium nitride film and moisture infiltrating through the oxide film from the opening portion for exposing the pad portion because the generation of titanium oxide lowers the adhesion of the opposing surface, thereby allowing more moisture to infiltrate in the opposing surface.

In view of this, the inventors of the present invention have made a further study on the titanium nitride film as an anti-reflection film, the oxide film formed on the titanium nitride film, and the silicon nitride film formed as a protection film on the oxide film, while paying attention to planar arrangement around the pad portion. A positional relation effective against the corrosion has been found as a result, in which the pad portion is formed inside the third opening portion formed in the oxide film in plan view, and the silicon nitride film is formed on top of and in contact with the titanium nitride film inside the third opening portion in plan view. In this positional relation, the first opening portion formed in the silicon nitride film and the second opening portion formed in the titanium nitride film have the same size and are positioned in overlapping places, thereby defining the perimeter of the pad portion, and the oxide film is placed apart from the pad portion. It may therefore be said that the third opening portion formed in the oxide film is outside the first opening portion and the second opening portion.

In a semiconductor device having this positional relation, the absence of the oxide film inside the third opening portion in plan view means that the titanium nitride film does not have the surface which opposes the oxide film and which is susceptible to corrosion, inside the third opening portion in plan view. In addition, the silicon nitride film, which has fine water resistance, is formed on top of and in contact with the titanium nitride film inside the third opening portion in plan view. Moisture can consequently be prevented from infiltrating in the surface of the titanium nitride film which opposes the oxide film from the opening portion for exposing the pad portion. The contact between the silicon nitride film and the top of the titanium nitride film also supplies nitrogen atoms from the silicon nitride film to the titanium nitride film, which causes reaction between dangling bonds of titanium atoms in the titanium nitride film and nitrogen atoms in the silicon nitride film. A dangling bond in a titanium atom tends to react with moisture infiltrating from the opening portion for exposing the pad, resulting in the generation of titanium oxide. In contrast, when a dangling bond in a titanium atom is occupied with a nitrogen atom as described above, moisture entering the titanium nitride film has a small chance of causing the generation of titanium oxide. As a result, corrosion is hardly caused on the titanium nitride film, and hence detachment at the boundary between the titanium nitride film and the silicon nitride film can be prevented, and the semiconductor device can be given high reliability.

The inventors of the present invention have also found out that, when the pad portion which exposes the wiring is formed at a place where the first opening portion formed in the silicon nitride film and the second opening portion formed in the titanium nitride film overlap with each other in plan view, and is inside the third opening portion formed in the oxide film in plan view, and the silicon nitride film is formed on top of and in contact with the titanium nitride film inside the third opening portion in plan view, production of the semiconductor device is efficient for a reason given below.

In the semiconductor device structured as this, the first opening portion to be formed in the silicon nitride film and the second opening portion to be formed in the titanium nitride film are formed continuously on an inner wall of the opening for exposing the pad portion. The first opening portion and the second opening portion can accordingly be formed by etching the silicon nitride film and the titanium nitride film successively with the use of the same mask. In addition, the same etching gas can be used to etch the silicon nitride film and the titanium nitride film. Efficient production of the semiconductor device is therefore accomplished by the successive etching method which uses the same etching gas and does not require switching the etching gas when the titanium nitride film is to be etched after the etching of the silicon nitride film.

The present invention is described in detail below with reference to the drawings. Some of the drawings referred to in the following description are enlarged views of characteristic portions, which are enlarged for convenience of making the characteristics of the present invention understood easier, and the ratios of the dimensions of components to one another and the like may differ from actuality. The materials, dimensions, and the like given in the following description are an example, and the present invention is not limited thereto. The present invention can be carried out in suitably varied modes without losing the effects of the present invention.

[Semiconductor Device]

Figure 1:
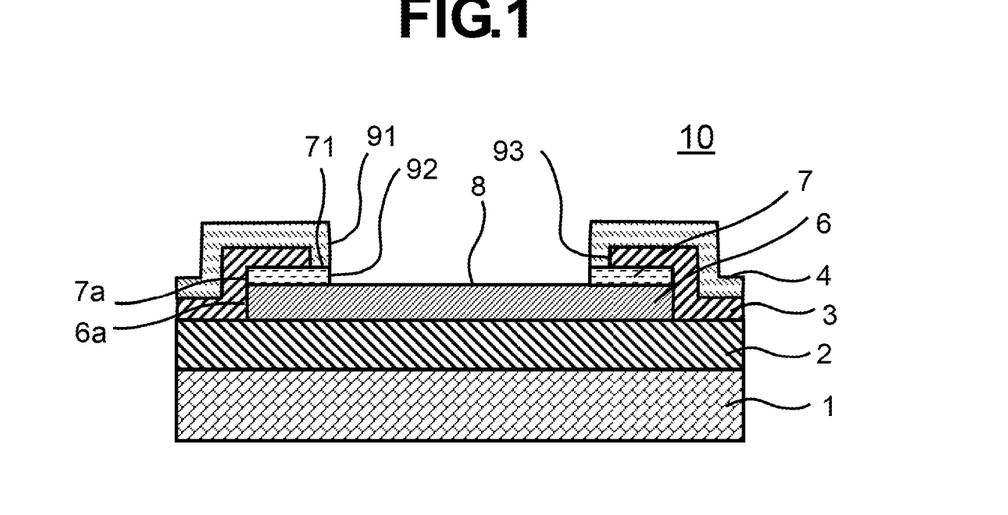
FIG. 1 is a schematic sectional view for illustrating an example of a semiconductor device according to the present invention.
Figure 2:
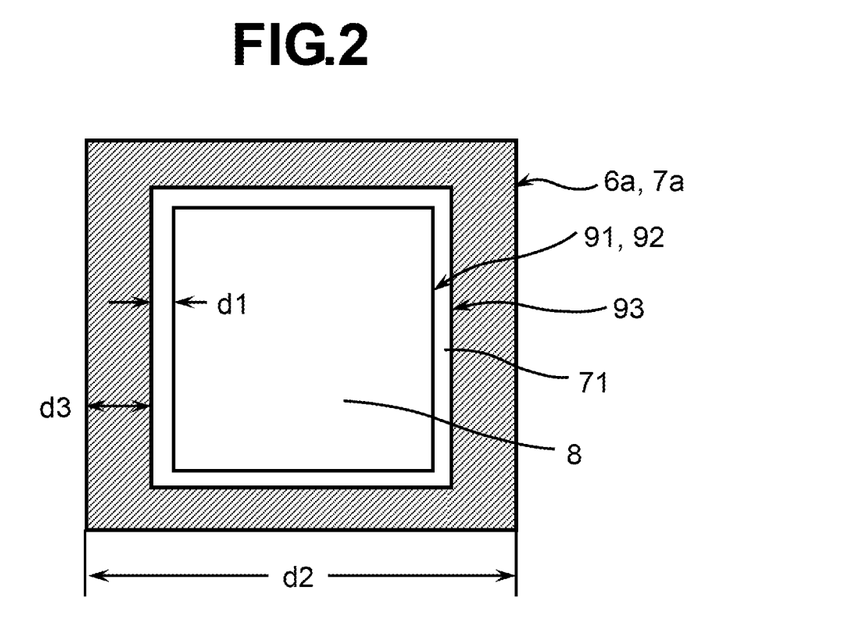
FIG. 2 is a plan view for illustrating planar arrangement around a pad portion in the semiconductor device of FIG. 1.

FIG. 1 is a schematic sectional view for illustrating an example of a semiconductor device according to the present invention. FIG. 2 is a plan view for illustrating planar arrangement around a pad portion in the semiconductor device of FIG. 1. The horizontal direction in FIG. 2 corresponds to the horizontal direction in FIG. 1.

A semiconductor device 10 of this embodiment includes a substrate 1, a wiring 6 which is formed above the substrate 1 with an interlayer insulating film 2 interposed between the two, a titanium nitride film 7 which is formed on the wiring 6 to serve as an anti-reflection film, an oxide film 3 which is formed on the titanium nitride film 7, and a silicon nitride film 4 which is formed on the oxide film 3 to serve as a protection film.

As illustrated in FIG. 1 and FIG. 2, in the semiconductor device 10 according to this embodiment, a pad portion 8 exposing the wiring 6 is formed at a place where a first opening portion 91 formed in the silicon nitride film 4 and a second opening portion 92 formed in the titanium nitride film 7 overlap with each other in plan view.

The pad portion 8 in the semiconductor device 10 according to this embodiment is also positioned, in plan view, inside a third opening portion 93 formed in the oxide film 3 as illustrated in FIG. 2.

The silicon nitride film 4 in the semiconductor device 10 according to this embodiment is formed on top of and in contact with the titanium nitride film 71 inside the third opening portion 93 in plan view as illustrated in FIG. 1 and FIG. 2.

A substrate made of silicon or other known materials can be used as the substrate 1.

The interlayer insulating film 2 can be a known insulating film, for example, a $SiO_2$ film, or an oxide film having tetraethyl orthosilicate (TEOS) ($Si(OC_2H_5)_4$) as a raw material.

The oxide film 3 is a protection film, and is formed so as to cover the wiring 6 which has on a top surface thereof the titanium nitride film 7 serving as an anti-reflection film.

A silicon oxide film is preferred as the oxide film 3. Specifically, a $SiO_2$ film, an oxide film having TEOS as a raw material, or a similar film can be used.

A preferred thickness of the oxide film 3 is from 2,000 Å to 8,000 Å, and a thickness of about 5,000 Å is even more preferred.

The silicon nitride film 4 is provided as a protection film. The silicon nitride film 4 which has excellent water resistance is a favorable protection film.

The silicon nitride film 4 is preferred to be high in nitrogen content in order to supply nitrogen atoms efficiently to the titanium nitride film 7 which is arranged so as to be in contact with the silicon nitride film 4. Specifically, preferred nitrogen content in the silicon nitride film is 1.2 times higher than the silicon content or more in atomic composition ratio. The nitrogen content in the silicon nitride film 4 can be measured by, for example, X-ray photoelectron spectroscopy (XPS).

A preferred thickness of the silicon nitride film 4 is from 5,000 Å to 15,000 Å, and a thickness of about 10,000 Å is even more preferred.

In the semiconductor device 10 of FIG. 1, the oxide film 3 is formed between the silicon nitride film 4 and the titanium nitride film 7 in a region outside the third opening portion 93 which lessens a difference in stress between the silicon nitride film 4 and the titanium nitride film 7 compared to the stress difference in a region inside the third opening portion 93 in which a part of the silicon nitride film 4 that is placed in this region is in contact with the titanium nitride film 7.

In the semiconductor device 10 of FIG. 1, the pad portion 8 which is made of aluminum or an aluminum alloy and the silicon nitride film 4 are not in contact with each other. This prevents a crack caused by a stress difference between the pad portion 8 and the silicon nitride film 4. In contrast, when the pad portion 8 and the silicon nitride film 4 are in contact with each other, for example, a large stress difference between the pad portion 8 and the silicon nitride film 4 can cause a crack in the silicon nitride film 4, which has the possibility of affecting the reliability of the semiconductor device 10.

The wiring 6 is made of aluminum or an aluminum alloy. Examples of the aluminum alloy used include an alloy of aluminum, silicon, and copper, an alloy of aluminum and copper, and an alloy of aluminum and silicon.

A preferred thickness of the wiring 6 is from 3,000 Å to 30,000 Å, and a thickness of about 20,000 Å is even more preferred.

The titanium nitride film 7 is an anti-reflection film and also serves as a wiring.

A preferred thickness of the titanium nitride film 7 is from 250 Å to 800 Å, and a thickness of about 400 Å is even more preferred.

In FIG. 1 and FIG. 2, a side surface of the wiring 6 placed around the pad portion 8 is indicated by a symbol 6a. A side surface of the titanium nitride film 7 placed around the pad portion 8 is indicated by a symbol 7a.

The pad portion 8 illustrated in FIG. 2 has a substantially square shape in plan view.

The wiring 6 in which the pad portion 8 is formed has a width d2 as illustrated in FIG. 2, and a width of 100 µm or more is preferred as the width d2.

The distance from the side surface 6a of the wiring 6 which forms the pad portion 8 and the perimeter of the pad portion 8 to the inner wall of the third opening portion 93 is d3 in plan view as illustrated in FIG. 2, and a distance of from 1.0 µm to 9.2 µm is preferred as the distance d3.

The shortest distance in plan view between the inner wall of the third opening portion 93 and an outer edge of the pad portion 8 (the outer edge is where the first opening portion 91 and the second opening portion 92 overlap with each other in plan view), in other words, the width of a part of the titanium nitride film 71 that is placed inside the third opening 93 in plan view, is d1 as illustrated in FIG. 2, and a distance of from 0.8 µm to 9.0 µm is preferred as the shortest distance d1. A distance of from 0.8 µm to 1.2 µm is even more preferred as the shortest distance d1. When the distance d1 between the inner wall of the third opening portion 93 and the outer edge of the pad portion 8 in plan view is 0.8 µm or longer, the effect of preventing the corrosion of the titanium nitride film 7 with the absence of the oxide film 3 inside the third opening portion 93 in plan view is remarkable. It is preferred that the distance d1 between the inner wall of the third opening portion 93 and the outer edge of the pad portion 8 in plan view is 9.0 µm or shorter so that the downsizing of the semiconductor device is hardly affected by providing a region that does not contain the oxide film 3 inside the third opening portion 93 in plan view.

[Method of Manufacturing Semiconductor Device]

A method of manufacturing a semiconductor device according to the present invention is described next by taking as an example a method of manufacturing the semiconductor device of FIG. 1 and FIG. 2. FIG. 3 to FIG. 8 are process views for illustrating an example of the method of manufacturing the semiconductor device of FIG. 1 and FIG. 2. FIG. 7 is a plan view for illustrating planar arrangement around the pad portion in the step of FIG. 6. The horizontal direction in FIG. 7 corresponds to the horizontal direction in FIG. 6.

To manufacture the semiconductor device 10 illustrated in FIG. 1 and FIG. 2, the interlayer insulating film 2 is formed first on one of the principal surfaces of the substrate 1, and a wiring layer 5 which includes the wiring 6 and the titanium nitride film 7 is formed on the interlayer insulating film 2.

Figure 3:
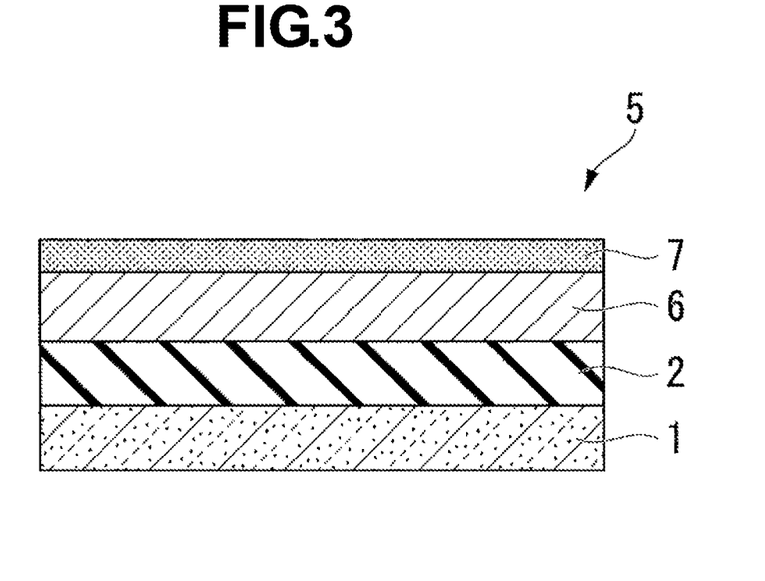
FIG. 3 is a process view for illustrating an example of a method of manufacturing the semiconductor device of FIG. 1 and FIG. 2.

Specifically, the interlayer insulating film 2 is formed on the substrate 1 as illustrated in FIG. 3 by chemical vapor deposition (CVD) or other methods. The wiring 6 is then formed on the interlayer insulating film 2 by sputtering or other methods (a wiring step).

The titanium nitride film 7 is formed next on the wiring 6 as illustrated in FIG. 3 by reactive sputtering that uses argon gas (Ar) and nitrogen gas ($N_2$) (an anti-reflection film forming step).

Figure 4:
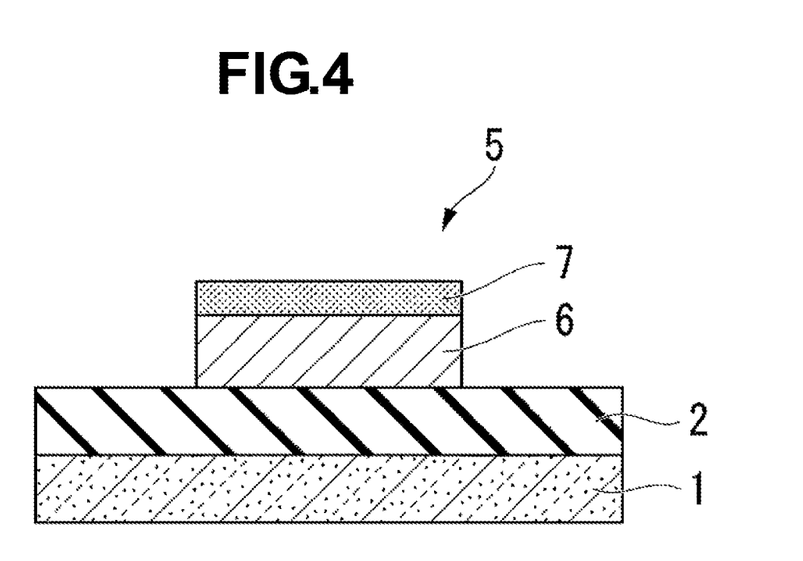
FIG. 4 is a process view for illustrating the example of the method of manufacturing the semiconductor device of FIG. 1 and FIG. 2.

Next, the wiring 6 and the titanium nitride film 7 are patterned into a given shape as illustrated in FIG. 4 with the use of a known photolithography method and a known etching method. In the example illustrated in FIG. 1 and FIG. 2, the wiring layer 5 which includes the wiring 6 and the titanium nitride film 7 is formed by patterning the wiring 6 and the titanium nitride film 7 both into the same shape.

Figure 5:
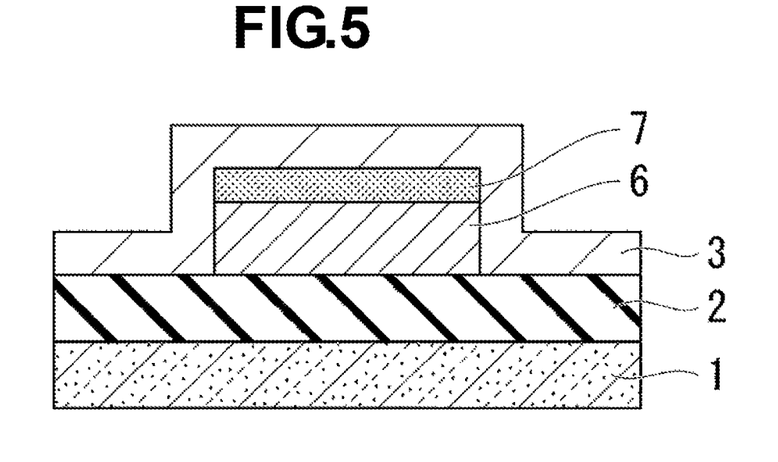
FIG. 5 is a process view for illustrating the example of the method of manufacturing the semiconductor device of FIG. 1 and FIG. 2.

The oxide film 3 is formed next on the wiring layer 5 which includes the wiring 6 and the titanium nitride film 7 so as to cover the wiring layer 5 as illustrated in FIG. 5 by plasma CVD or other methods.

Figure 6:
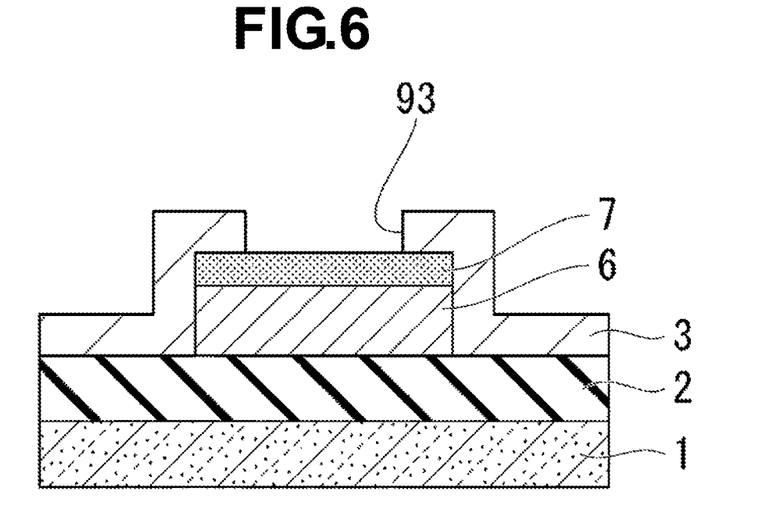
FIG. 6 is a process view for illustrating the example of the method of manufacturing the semiconductor device of FIG. 1 and FIG. 2.
Figure 7:
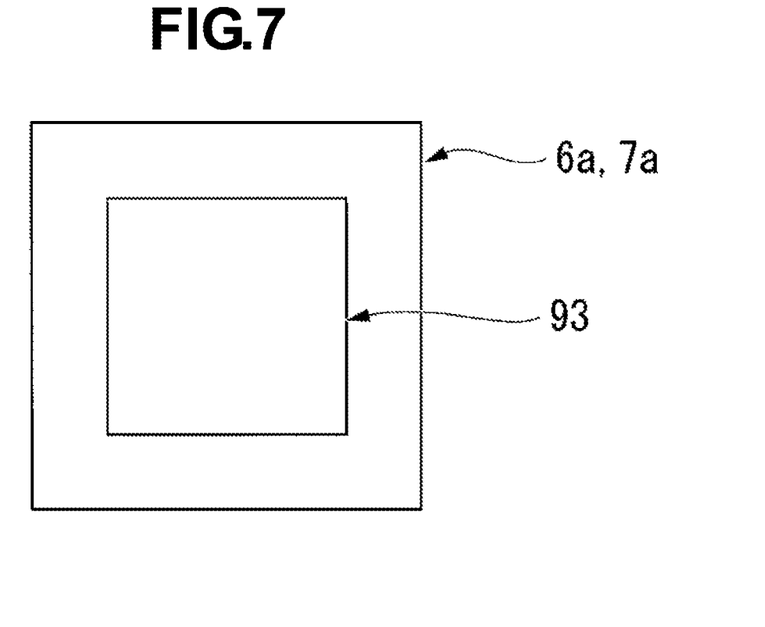
FIG. 7 is a plan view for illustrating planar arrangement around the pad portion in the step of FIG. 6.

The oxide film 3 is patterned next as illustrated in FIG. 6 with the use of a known photolithography method and a known etching method. The third opening portion 93 which pierces the oxide film 3 and exposes the titanium nitride film 7 at the bottom as illustrated in FIG. 6 and FIG. 7 is formed in this manner (a third opening portion forming step). In FIG. 6 and FIG. 7, a side surface of the patterned wiring 6 is indicated by the symbol 6a, and a side surface of the patterned titanium nitride film 7 is indicated by the symbol 7a.

Etching gas used to etch the oxide film 3 can be, for example, a mixed gas containing $CHF_3$, $CF_4$, and Ar.

Figure 8:
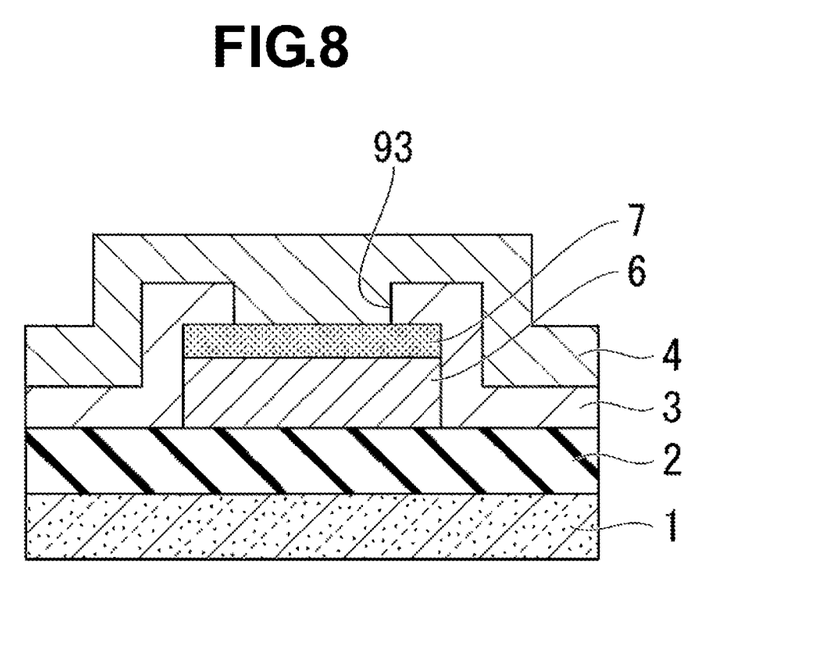
FIG. 8 is a process view for illustrating the example of the method of manufacturing the semiconductor device of FIG. 1 and FIG. 2.

Next, the silicon nitride film 4 is formed on the oxide film 3 and above the third opening portion 93 as illustrated in FIG. 8 by plasma CVD or other methods (a protection film forming step).

It is preferred to give the silicon nitride film 4 a high nitrogen content by forming the silicon nitride film 4 under a condition in which the flow rate of gas containing nitrogen ($N_2$ or $NH_3$) is set high in plasma CVD, in order to supply nitrogen atoms efficiently to the titanium nitride film 7 which is arranged so as to be in contact with the silicon nitride film 4.

Next, a known photolithography method and a known etching method are used to etch the silicon nitride film 4 and the titanium nitride film 7 successively with the use of the same mask and the same etching gas. In this manner, the pad portion 8 which exposes the wiring 6 at the bottom through the silicon nitride film 4 and the titanium nitride film 7 is formed inside the third opening portion 93 in plan view as illustrated in FIG. 1 (a pad portion forming step).

Etching gas used to etch the silicon nitride film 4 and the titanium nitride film 7 can be $CF_4$ gas, for example.

In this embodiment, it is preferred to form the pad portion 8 in the pad portion forming step at a place where the shortest distance d1 in plan view between the inner wall of the third opening portion 93 and the outer edge of the pad portion 8 (the outer edge is where the first opening portion 91 formed in the silicon nitride film 4 and the second opening portion 92 formed in the titanium nitride film 7 overlap with each other in plan view) (in other words, the width of the part of the titanium nitride film 71 that is placed inside the third opening portion 93 in plan view) is from 0.8 µm to 9.0 µm. With the distance d1 set to from 0.8 µm to 9.0 µm, the resultant semiconductor device 10 is hardly affected in terms of downsizing and effectively prevents the corrosion of the titanium nitride film 7.

Through the steps described above, the semiconductor device 10 illustrated in FIG. 1 is obtained.

In the semiconductor device 10 according to this embodiment, the pad portion 8 is formed at a place where the first opening portion 91 formed in the silicon nitride film 4 and the second opening portion 92 formed in the titanium nitride film 7 overlap with each other in plan view, and is inside the third opening portion 93 formed in the oxide film 3 in plan view, and the silicon nitride film 4 is formed on top of and in contact with the titanium nitride film 7 inside the third opening portion 93 in plan view. This makes the titanium nitride film 7 serving as an anti-reflection film resistant to corrosion, thereby giving high reliability to the semiconductor device 10.

In addition, in the semiconductor device 10 according to this embodiment, the pad portion 8 is formed at a place where the first opening portion 91 formed in the silicon nitride film 4 and the second opening portion 92 formed in the titanium nitride film 7 overlap with each other in plan view, and is inside the third opening portion 93 formed in the oxide film 3 in plan view. The pad portion 8 made of aluminum or an aluminum alloy is therefore not in contact with the silicon nitride film 4. There is accordingly no chance for a drop in reliability of the semiconductor device 10 that is caused by a stress difference between the pad portion and the silicon nitride film as when the pad portion made of aluminum or an aluminum alloy and the silicon nitride film are in contact with each other.

In the method of manufacturing the semiconductor device 10 according to this embodiment, the pad portion 8 exposing the wiring 6 at the bottom is formed by etching the silicon nitride film 4 and the titanium nitride film 7 successively with the use of the same mask and the same etching gas, and efficient production of the semiconductor device 10 is consequently accomplished.

In contrast, with the technology described in Japanese Patent No. 5443827, the anti-reflection film made of titanium nitride is removed by etching after the first surface protection film formed from a silicon oxide film is patterned by etching in order to form the first opening portion. It is difficult to etch a silicon oxide film and a titanium nitride film with the use of the same etching gas. The trouble of switching the etching gas at the time when the titanium nitride film is etched therefore cannot be eliminated even by, for example, using the same mask to etch the silicon oxide film and the titanium nitride film, and an obstacle to the improvement of productivity of the semiconductor device 10 remains.

The semiconductor device according to the present invention is not limited to the semiconductor device 10 of the embodiment described above.

The description given above on the embodiment takes as an example a case in which the pad portion 8 in the semiconductor device 10 has a substantially square shape in plan view. However, the shape of the pad portion 8 in plan view is not particularly limited. The shape of the pad portion 8 in plan view may be a quadrangular shape, for example, a substantially rectangular shape, a substantially rhomboidal shape, or a substantially trapezoidal shape, or may be a substantially circular shape, or may be a polygonal shape, for example, a substantially triangular shape, a substantially pentagonal shape, or a substantially hexagonal shape.

The description given above on the embodiment takes as an example a case in which the semiconductor device 10 has one wiring layer 5 including the wiring 6 and the titanium nitride film 7. In addition to the wiring layer described above, one or more wiring layers made of known materials may be included. When the semiconductor device 10 is provided with a plurality of wiring layers, it is preferred for the wiring layer 5 that includes the wiring 6 and the titanium nitride film 7 to be the topmost wiring layer.

The semiconductor device according to the present invention may further include layers having various functions to suit its use.

[Comparison]

Now, effects of the present invention are further clarified from the description of example for comparison according to the present invention. The present invention is not limited to the following examples, and modifications can be made thereto as appropriate within the range not changing the gist of the present invention.

Example 1

A semiconductor device of Example 1 illustrated in FIG. 1 was obtained by a manufacturing method described below.

First, the interlayer insulating film 2 was formed from a $SiO_2$ film on the substrate 1 made of silicon as illustrated in FIG. 3 by CVD. The wiring 6 made of aluminum and having a thickness of 20,000 Å was then formed on the interlayer insulating film 2 by sputtering (the wiring step).

The titanium nitride film 7 having a thickness of 400 Å was formed next on the wiring 6 by reactive sputtering that used argon gas (Ar) and nitrogen gas ($N_2$) (the anti-reflection film forming step).

Next, the wiring 6 and the titanium nitride film 7 were patterned as illustrated in FIG. 4 with the use of photolithography and etching to form the wiring layer 5 including the wiring 6 and the titanium nitride film 7.

The oxide film 3 having a thickness of 5,000 Å was formed next from a $SiO_2$ film on the wiring layer 5 including the wiring 6 and the titanium nitride film 7 as illustrated in FIG. 5 by plasma CVD so as to cover the wiring layer 5.

The oxide film 3 was then patterned with the use of photolithography and etching to form the third opening portion 93 which pierced the oxide film 3 and exposed the titanium nitride film 7 at the bottom as illustrated in FIG. 6 and FIG. 7 (the third opening portion forming step).

A mixed gas containing $CHF_3$, $CF_4$, and Ar was used as etching gas to etch the oxide film 3.

Next, the silicon nitride film 4 having a thickness of 10,000 Å was formed on the oxide film 3 and above the third opening portion 93 as illustrated in FIG. 8 by plasma CVD (the protection film forming step).

The silicon nitride film 4 was given a high nitrogen content by forming the silicon nitride film 4 under a condition in which the flow rate of gas containing nitrogen ($N_2$ or $NH_3$) is set high in plasma CVD.

Next, the silicon nitride film 4 and the titanium nitride film 7 were etched successively with the use of the same mask and the same etching gas by photolithography and etching to form the pad portion 8 which exposed the wiring 6 at the bottom through the silicon nitride film 4 and the titanium nitride film 7, inside the third opening portion 93 in plan view as illustrated in FIG. 1 (the pad portion forming step).

Etching gas used to etch the silicon nitride film 4 and the titanium nitride film 7 was $CF_4$ gas.

Through the steps described above, the semiconductor device 10 of Example 1 illustrated in FIG. 1 was obtained.

The distance d1 in plan view between the inner wall of the third opening portion 93 and the outer edge of the pad portion 8 in the obtained semiconductor device 10 of Example 1 was 1.0 μm. The width d2 of the wiring 6 in which the pad portion 8 was formed was 100 μm or more. The distance d3 in plan view from the inner wall of the third opening portion 93 to the side surface 6a of the wiring 6 which formed the pad portion 8 and the perimeter of the pad portion 8, was 9.0 μm.

Comparative Example 1

Figure 9:
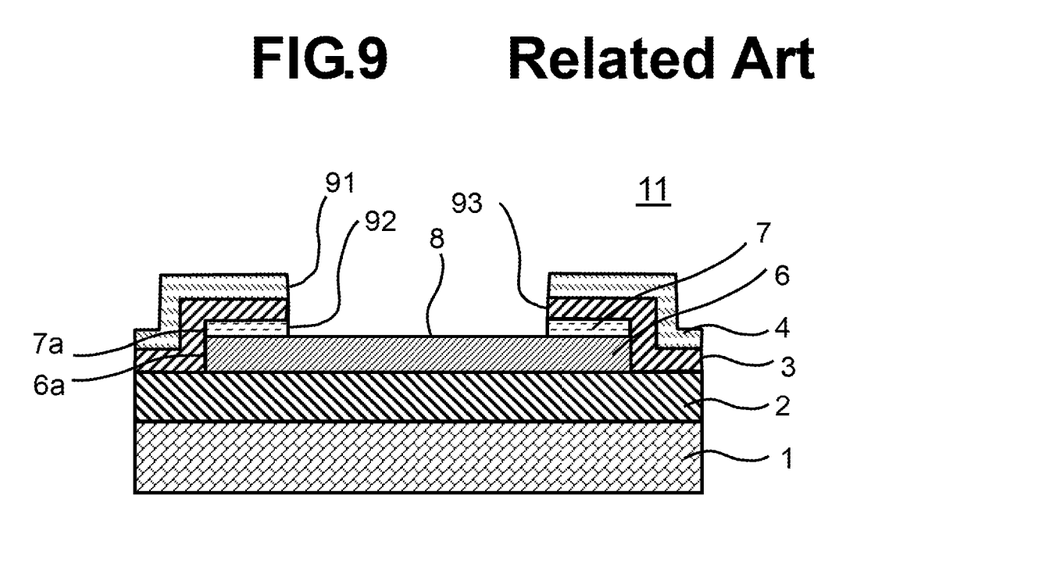
FIG. 9 is a schematic sectional view for illustrating an example of a semiconductor device of the related art.

A semiconductor device 11 of Comparative Example 1 illustrated in FIG. 9 was obtained in the same manner as in Example 1, except that the silicon nitride film 4 was formed on the oxide film 3 without performing the third opening portion forming step, and that the pad portion 8 exposing a wiring at the bottom through the silicon nitride film 4, the oxide film 3, and the titanium nitride film 7 was formed with the use of photolithography and etching. Members of the semiconductor device 11 illustrated in FIG. 9 that are the same as those of the semiconductor device 10 illustrated in FIG. 1 are denoted by the same symbols, and descriptions on the members are omitted.

In steps of manufacturing the semiconductor device 11 of Comparative Example 1, $CF_4$ gas was used as etching gas to etch the silicon nitride film 4. The etching gas was then switched to a mixed gas containing $CHF_3$, $CF_4$, and Ar to etch the oxide film 3. Thereafter, the etching gas was switched to $CF_4$ gas to etch the titanium nitride film 7.

The pad portion 8 in the semiconductor device 11 of Comparative Example 1 is formed at a place where the first opening portion 91 formed in the silicon nitride film 4, the third opening portion 93 formed in the oxide film 3, and the second opening portion 92 formed in the titanium nitride film 7 overlap with one another in plan view.

The thus obtained semiconductor devices 10 and 11 of Example 1 and Comparative Example 1 were subjected to the following long-term reliability test (THB) involving bias application under a high-temperature and high-humidity environment, and were evaluated by criteria given below.

"Long-Term Reliability Test (THB)"

The semiconductor device 10 of Example 1 and the semiconductor device 11 of Comparative Example 1 were each packaged into a resin package to create twenty-two samples for each semiconductor device. A voltage was applied to each sample for 1,000 hours in an environment in which the temperature was 85° C. and the humidity was 85%. Each resin package was then opened, and a portion around the pad portion was observed with a microscope to conduct an appearance test by the following criteria.

"Criteria"

Appearance is fine: there is no corrosion, detachment, or discoloration in the pad portion or around the pad portion.

Appearance is defective: corrosion, detachment, or discoloration is found in the pad portion or around the pad portion.

After the long-term reliability test (THB), the number of defective appearance samples (the number of defective appearance samples/the total number of samples) was 0/22 in the semiconductor device of Example 1, and 3/22 in the semiconductor device of Comparative Example 1.

It is clear from this result that corrosion of the titanium nitride film was prevented better in the semiconductor device 10 of Example 1 than in the semiconductor device 11 of Comparative Example 1.

What is claimed is:

1. A method of manufacturing a semiconductor device, comprising:

forming a wiring above a substrate;

forming a titanium nitride film on the wiring;

forming an oxide film on the titanium nitride film, and patterning the oxide film to form a third opening portion which exposes the titanium nitride film at a bottom of the third opening portion through the oxide film;

forming a silicon nitride film on the oxide film and on the third opening portion; and etching the silicon nitride film and the titanium nitride film successively with the same etching gas to form a pad portion which penetrates the silicon nitride film and the titanium nitride film, and which exposes the wiring at the bottom inside the third opening portion in a plan view.

2. The method of manufacturing a semiconductor device according to claim 1, wherein, in forming the pad portion, the pad portion is positioned so that a shortest lateral distance between an inner wall of the third opening portion and an overlap of a first opening portion formed in the silicon nitride film and a second opening portion formed in the titanium nitride film in the plan view is from 0.8 μm to 9.0 μm.

* * * * *